United States Patent [19]

Brignet et al.

[11] Patent Number: 5,030,309
[45] Date of Patent: Jul. 9, 1991

[54] METHOD FOR MAKING CARDS, IN PARTICULAR MEMORY CARDS

[75] Inventors: Marc Brignet, Paris; Emile Droche, La Garenne Colombes, both of France

[73] Assignee: Schlumberger Industries, Montrouge, France

[21] Appl. No.: 382,057

[22] Filed: Jul. 14, 1989

Related U.S. Application Data

[63] Continuation of Ser. No. 114,236, Oct. 14, 1987, abandoned.

[30] Foreign Application Priority Data

Oct. 14, 1986 [FR] France ............................ 86-14231

[51] Int. Cl.⁵ ............................................. B29C 45/03
[52] U.S. Cl. ..................................... 156/245; 156/293; 235/487; 264/328.1
[58] Field of Search ............... 156/245, 293; 29/831, 29/835, 841, 856; 235/482, 483, 487, 488, 490, 492, 493, 495; 283/72, 82, 101, 904; 264/328.1

[56] References Cited

U.S. PATENT DOCUMENTS 4,500,777  2/1985  Drexler .............................. 235/487
4,687,231  8/1987  Hartmann ............................ 383/82

FOREIGN PATENT DOCUMENTS 15289   1/1986  Japan ................................. 235/487
133489  6/1986  Japan ................................. 235/487
183791  8/1986  Japan ................................. 235/487

OTHER PUBLICATIONS

Saechtling, "Kunststoff Taschenbuch", 22nd edition, published by Hauser.

Primary Examiner—Caleb Weston
Attorney, Agent, or Firm—Frishauf, Holtz, Goodman & Woodward

[57] ABSTRACT

According to the invention the card body is made by molding a plastic material such as ABS. The mold (20, 22) includes a core (24) serving to define a cavity in the card body for the purpose of receiving a card electronic module.

13 Claims, 4 Drawing Sheets

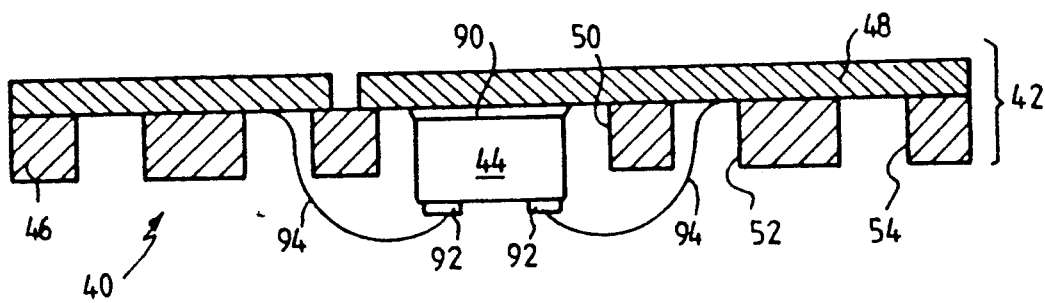
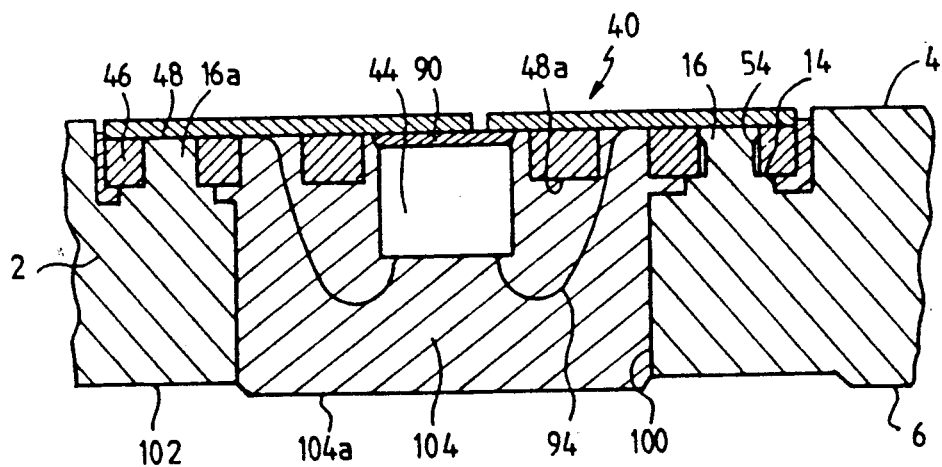
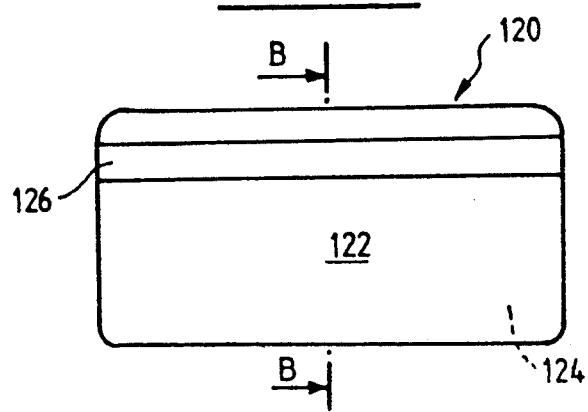
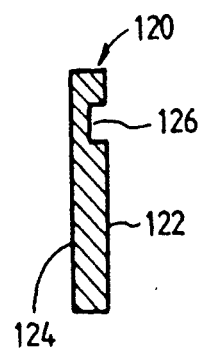

METHOD FOR MAKING CARDS, IN PARTICULAR MEMORY CARDS

This application is a continuation of application Ser. No. 07/114,236, filed on Oct. 14, 1987, now abandoned, entitled A METHOD FOR MAKING CARDS, IN PARTICULAR MEMORY CARDS.

The present invention relates to a method of making cards, and in particular cards including memory and particularly electronic memory.

BACKGROUND OF THE INVENTION

Memory cards essentially comprise a card body which is generally made of a plastic material together with a memory module. In cards having an electronic memory, the memory module is an electronic module essentially comprising a semiconductor chip having an integrated circuit formed thereon together with a piece of printed circuit having the chip fixed thereto and serving to define external contact tabs. The electronic module is fixed in the body of the card so that the electrical contact tabs are level with one of the main faces of the card body.

The card body is in the form of a rectangular parallelipiped having a thickness which must be less than 1 mm. The edges of the card body serve as references for positioning the card in a card reader so that the contact tabs of the card come into electrical contact with a connector in the card reader.

Two main techniques are used for making the card body and for implanting the electronic module therein. In the first technique, the card body is made by hot rolling a plurality of sheets of plastic material such as PVC. The electronic module is put into place in the stack of sheets of plastic material prior to rolling. After the rolling operation, the electronic module is solidly retained in the card body. This method has the advantage of making the card body and implanting the electronic module therein in a single step. However, it is a difficult method and requires the periphery of the card body to be re-machined.

The second technique consists in making the card body in a first step, in machining a cavity in the card body to receive the electronic module, and in gluing the electronic module in the cavity. The machining of such a card body is always a difficult operation and is therefore expensive because very accurate tolerances must be maintained, in particular to ensure that the electronic module is properly positioned relative to the edges of the card and relative to the main face of the card body with which the electrical contact tabs are to be level.

It should also be added that the card body must additionally satisfy other specifications concerning the quality of its surface state and concerning well-defined bending properties both longitudinally and trnasversely relative to the card body. In addition, the card body must not encourge the storage of electrostatic charge.

An aim of the present invention is to provide a method of making cards, in particular cards having an electronic memory, and in particular for making the card body in such a manner as to reduce the cost of making a card body while also simplifying the operation of fixing the electronic module in the card body and yet still satisfying the above-mentioned specifications.

SUMMARY OF THE INVENTION

In order to achieve this aim, the present invention provides a card-making method comprising the following steps:

a mold is provided having a cavity which is substantially in the form of a rectangular parallelipiped with two substantially rectangular parallel main faces with the distance between said faces being about one millimeter;

a plastic material is injected into said cavity, said plastic material being selected from the group comprising:

acrylonitrile butadiene styrene, polystyrene, polypropylene, and polyamide 11; and the part obtained in this way is unmolded.

The method of making a memory card comprising a memory module and a card body in the form of a rectangular parallelipiped is characterized in that it comprises the following steps:

the card body is made by molding a plastic material by injection into a mold defining the two main faces of the card body, the edges of the card, and at least one cavity suitable for receiving a memory module and opening out into one of said main faces;

after unmolding, the memory module is put into place in said cavity; and said memory module is fixed to the card body.

The memory module is preferably an electronic module comprising a semiconductor chip together with electrical contact tabs.

In a preferred implementation, injection takes place through a mold face corresponding to one of the main faces of the card body and level with said cavity.

Also preferably, the material used for injection is an acrylonitrile butadiene styrene.

BRIEF DESCRIPTION OF THE DRAWINGS

The invention will be better understood from reading the following description of several implementations of the invention given by way of non-limiting example. The description refers to the accompanying drawings, in which;

FIG. 2 is a fragmentary section on line II—II of FIG. 1a;

FIG. 5 is a vertical section view through an electronic module for mounting on the card body of FIGS. 1 and 2;

FIG. 8 is a fragmentary view of the card showing the electronic module implanted in the card body; and FIGS. 9a and 9b show an embodiment of the card body in which the memory module is magnetic.

MORE DETAILED DESCRIPTION

Figure 1:
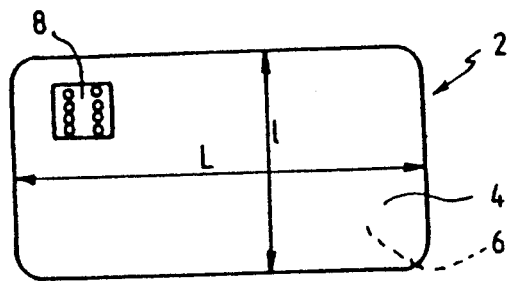
FIG. 1 is a plan view of a card body in accordance with the invention.
Figure 2:
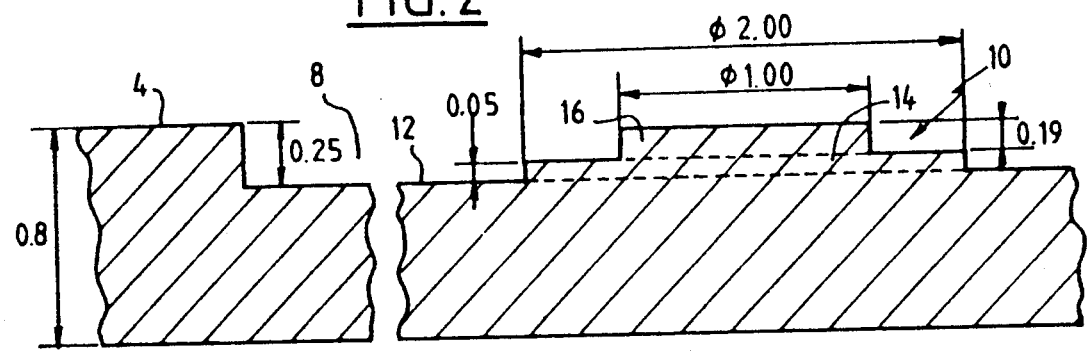

With reference initially to FIGS. 1 and 2, there follows a description of one particular form of card body made in accordance with the invention.

The body 2 has the form of a rectangular parallelipiped with two main faces 4 and 6 which are generally rectangular in shape. The dimensions of the main faces are approximately 85 mm (length L) by 55 mm (width 1). The thickness of the card body is about 0.8 mm. As can be seen in FIG. 1, the card body also includes a cavity 8 which opens out into main face 4. The cavity 8 has a constant depth of 0.25 mm and its dimensions in the plane of the main face 4 are 11 mm by 13 mm.

FIG. 1 shows that the cavity 8 includes eight studs 10 which project from its bottom 12. The studs are disposed in two parallel lines.

FIG. 2 shows that each stud 10 comprises a base 14 having a diameter of 2 mm and a thickness of 0.05 mm, together with a terminal portion 16 of diameter 1 mm and of thickness 0.19 mm.

In accordance with the invention, the card body is made by hot injection molding. The plastic material used is an acryolonitrile butadiene styrene. The material is injected into the mold at a temperature lying between 180° C. and preferably between 220° C. and 260° C., and the mold is maintained at a temperature lying between 5° C. and 100° C., and preferably between 10° C. and 50° C.

Other plastic materials could also be used, e.g. polystyrene, polypropylene, and polyamine 11, in which case the injection parameters will need changing.

Figure 3:
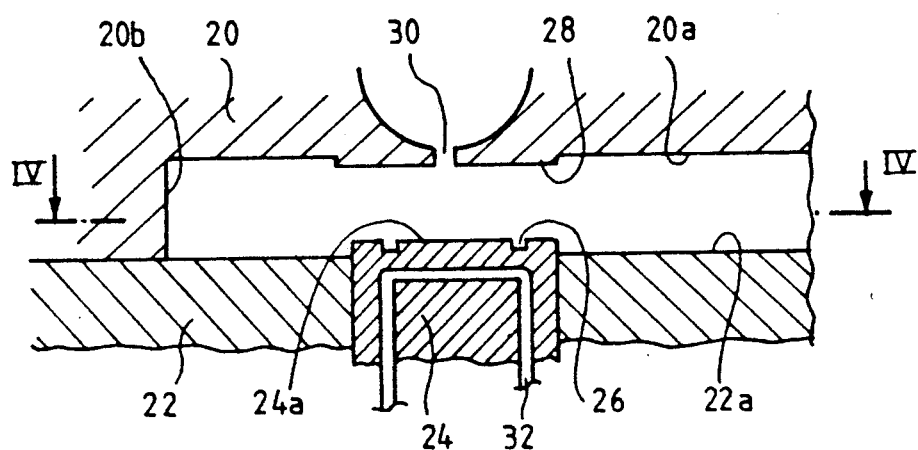
FIG. 3 is a simplified horizontal section through a mold for making a card body in accordance with the invention.
Figure 4:
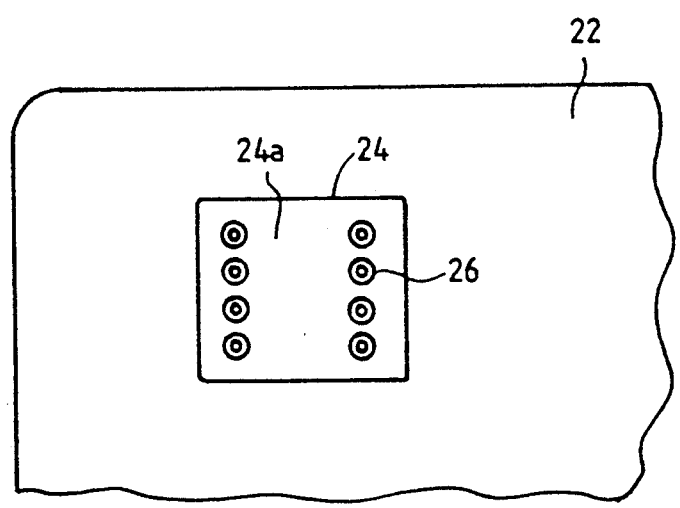
FIG. 4 is a vertical section view through the FIG. 3 mold on line IV—IV.

With reference to FIGS. 3 and 4, there follows a description in greater detail of an example of a mold for implementing the invention. The mold comprises a fixed front portion 20 and a moving rear portion 22. The front portion 20 has a main face 20a which defines the main face 6 of the card body and a side wall 20b which defines the edge of the card. The rear portion 22 has a face 22a which defines the second main face 4 of the card body. A core 24 is mounted in the portion 22 and serves to make the cavity 8. The core therefore occupies the same position in the face 22a of the portion 22 as is occupied by the cavity 8 in the face 4 of the card body. The face 24a of the core 24 defines the bottom 12 of the cavity and includes eight stepped hollows 26 which define the shape of the studs 10.

Returning to the portion 20, it can be seen that the face 20a includes a portion 28 which projects slightly and faces the core 24. The injection channel 30 opens out into the projection 28. This channel opens out opposite the center of the face 24a of the core 24, i.e. opposite the center of the cavity 8. Naturally, when the two portions 20 and 22 are fixed together, the space between them defines the mold volume and thus the volume of the card. It should be added that the core 24 placed opposite the injection point is provided with a cooling system represented by cooling liquid flow duct 32. Various tests have been performed and have shown that the above method makes it possible to obtain card bodies under highly satisfactory economic conditions while satisfying the above-mentioned specifications, in spite of the general shape of the part which is unfavorable for molding, in particular in spite of its thinness (0.8 mm).

In particular, by virtue of the particular injection technique, the card body has good bending characteristics and its longitudinal dimension (L) and its transverse dimension (1) are good and satisfy the requirements of the ISO standard. More precisely, this standard requires that after 250 bending operations with a central offset of 5 mm when bending across the width and a central offset of 10 mm when bending along the length, the apparent width of the card should remain less than 0.94 mm.

In addition, the advantages of the method in accordance with the invention appear clearly. The card body with the shape in particular of its cavity including the studs is obtained in a single operation and the position of the cavity relative to the edges is fully repeatable.

Returning to FIG. 3, it is obvious that the core 24 could be omitted providing the face 22a of mold portion 22 is machined in such a manner as to define itself a shape corresponding to the end 24a of the core. It should also be added that the method of the invention may be applied to making other shapes of card body, in particular bodies having different cavity shapes and different numbers of cavities. In a card body having a plurality of cavities, it may be advantageous to provide one injection point level with each cavity.

Another important advantage of the method in accordance with the invention is that the card body may be embossed using conventional techniques. In many card applications the manufacturer is required to emboss personalizing information on one of the faces of the card.

It must also be underlined that the card body obtained in this way is capable of receiving a magnetic track and of being silk-screen printed with figures or text.

There follows a description with reference to FIGS. 5 to 8 of the method of manufacturing an electronic memory card using a card body obtained by the molding method in accordance with the invention.

FIG. 5 shows an electronic module 40 which is to be implanted in the card body 2. The electronic module essentially comprises a single sided printed circuit 42 and a semiconductor chip 44 having appropriate electronic circuits made thereon, and in particular having memory circuits.

The printed circuit 42 includes an insulating support 46 made of polyester with a layer of conductive material, typically copper, being disposed on one of the faces thereof. As can be seen better in FIG. 7, the insulating support 46 is pierced by a central window 50, by eight bonding holes 52 surrounding the central window 50, and by eight pre-fastening holes 54. The eight pre-fastening holes 54 occupy the same physical dispositions as the eight studs 10 of the card body and they are of very slightly larger diameter than the terminal portions 16 of the studs.

Figure 6:
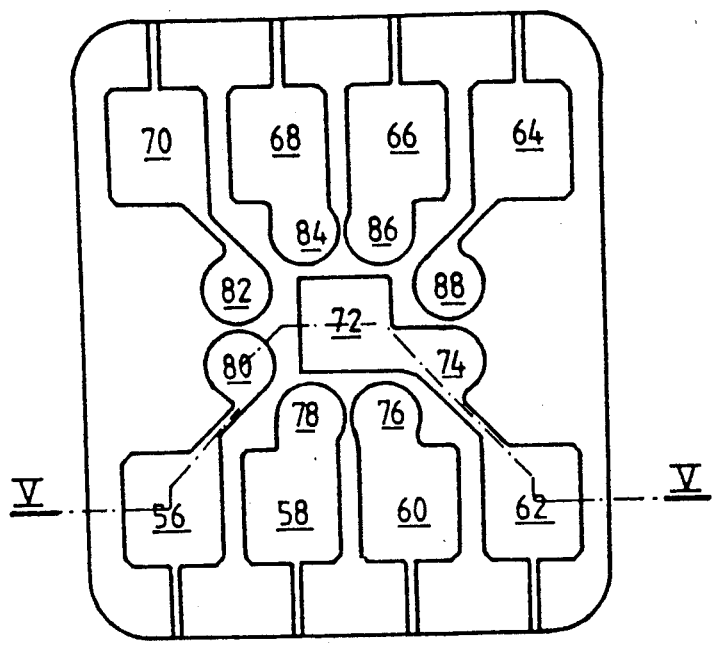
FIGS. 6 and 7 show the printed circuit of the electronic module as seen from above and from below, respectively.
Figure 7:
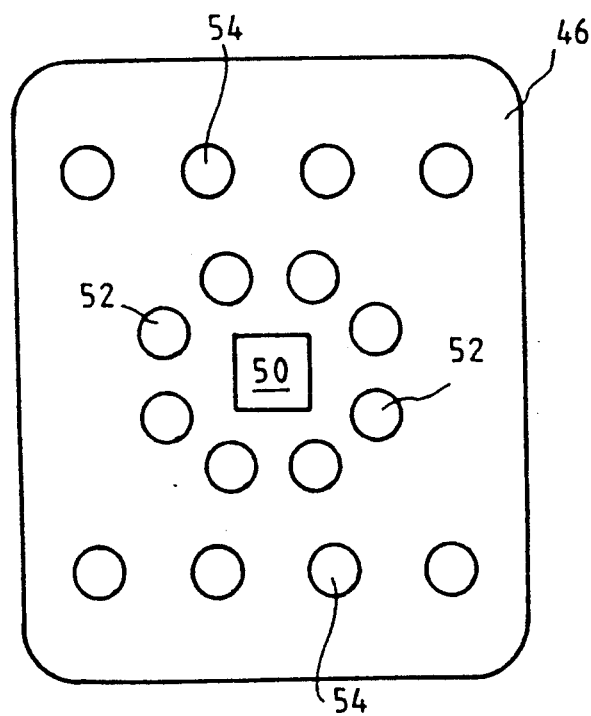

With reference to FIG. 6, it can be seen that the layer of metallization 48 is etched so as to define:
(a) eight electrical contact tabs 56 to 70 which are disposed over the pre-fastening holes;
(b) nine electrical contact points 72 to 88 corresponding to the central window 50 and to the eight bonding holes 52; and
(c) conducting tracks for interconnecting each contact point to an electrical connection tab and also for connecting the central metallization 72 to contact point 74.

Returning to FIG. 5, it can be seen that the semiconductor chip 44 is placed in the central window 50 and is fixed on the central metallization 72 by a conductive glue 90. In addition, each terminal 92 of the chip 44 is connected to a corresponding one of the contact points 74 to 88 by a conducting wire 94 whose opposite end passes through the corresponding bonding hole 52 and is bonded to the face of the contact point which closes the bottom of the bonding hole. Thus, each terminal 92 of the semiconductor chip together with the rear face thereof is electrically connected to a contact tab.

The insulating support 46 is 150 microns thick and the metallization layer 48 is 50 microns thick. It may be observed that the thickness of the insulating support of the printed circuit is less than the height of the terminal portion 16 of each stud 10.

FIG. 8 shows the electronic module 40 implanted in the card body as made by molding.

Figure 1A:
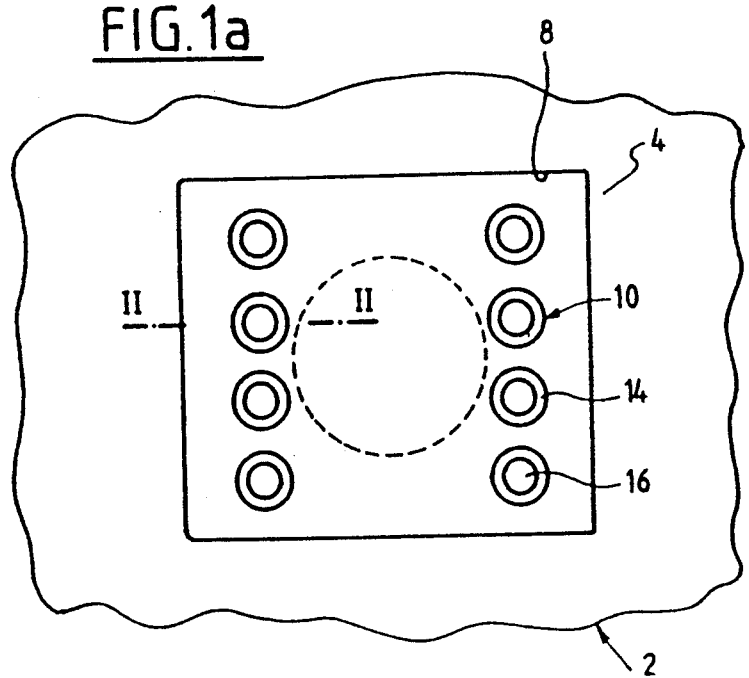
FIG. 1a is a detail view of FIG. 1 showing the cavity provided in the card body.

In a prior step, a hole 100 is made which opens out firstly into the cavity 8 between the two lines of studs 10 (see the dashed line circle in FIG. 1a) and secondly into a hollow 102 provided in the face 6 of the card body by the projecting portion 28 of the injection mold.

The electronic module 40 is put into place in the cavity 8 of the body 2 in such a manner that the terminal portions 16 of the studs penetrate into the pre-fastening holes 54. The face 48a of the printed circuit is not in contact with the bases 14 of the studs. The space remaining is about 0.040 mm across.

In the following step, the metallizations 48 over the prefastening holes 54 are heated. As a result the ends of the terminal portions 16 of the studs are deformed and expand as shown at 16a in FIG. 9. This gives rise to pre-fastening and positions the electronic module 40 on the card body 2. In particular, the face 48a of the printed circuit 42 comes into contact with the bases 14 of the studs 10.

The card body can then be turned over in order to terminate fixing of the electronic module 40.

Glue is caused to penetrate through the hole 100, e.g. a hot setting epoxy glue (104) which fills the hole 100 together with the space left free between the bottom 12 of the cavity 8 and the printed circuit. As a result the module is finally glued to the card body and the hole 100 is filled, thereby simultaneously providing the protective covering for the semiconductor chip 44 and its connection wires 94. By virtue of the hollow 102, it is possible to mill the face 104a of the glue deposit 104 without running the risk of spoiling the face 6 per se of the card body.

The above description relates more particularly to putting an electronic module of the type shown in FIG. 5 into place. However, it should be understood that the method of the invention may be used to making electronic memory cards including other types of electronic modules. In particular, instead of providing electrical connection tabs, the connection with the card reader could be provided by inductive coupling. Similarly, instead of having studs on the bottom of the cavity in order to position and pre-fasten the electronic module, other forms of relief could be provided, on the condition that they can be made by molding. The method may also be implemented without making the hole 100.

In this case, the glue is inserted into the cavity through the front face of the electronic module, or else the glue is put onto the rear face of the printed circuit before the electronic module is put into place on the card body. Finally, the memory module could be a magnetic memory component.

FIGS. 9a and 9b show the body of a card made in accordance with the invention and suitable for receiving a memory module constituted by a magnetic track.

The card body 120 has the same rectangular shape as the card body shown in FIG. 1 and the same outside dimensions. It includes two main faces 122 and 124 which are mutually parallel and it is 0.8 mm thick. A cavity 126 running parallel to one of the long sides of the card is formed in the face 122 and said cavity extends over the entire length of the card. As seen better in FIG. 9b, cavity 126 has a uniform rectangular cross-section. The depth of the cavity is about 0.2 mm.

Such a card body 126 is obtained by molding in accordance with the above-described technique. The only difference lies in the shape of the molding core which must be complementary to the shape of the cavity. The plastic material injection duct opens out into the core defining the cavity.

The magnetic track is put into place in the cavity and is fixed to the card body either by gluing or by hot-rolling.

We claim:

1. A method for making an electronic memory card comprising a card body which is substantially in the form of a rectangular parallelipiped having two main faces, said card body satisfying the requirements of the ISO standard regarding the dimensions of the card body and the bending properties of said card body, said card body containing an electronic module constituting a data medium, the method comprising the steps of:
   (a) providing a mold having an inner mold volume limited by two parallel main faces substantially rectangular and an edge, said main faces being separated by a distance less than 1 mm, one of said main faces being provided with a projection for defining a cavity in the card body;
   (b) injecting into said mold volume a thermoplastic material, for said plastic material to fill all of said mold volume to form the entire card body therewith;
   (c) unmolding the card body so obtained;
   (d) providing an electronic module; and
   (e) fixing said electronic module into the cavity produced by the projection on said one of said main faces of said mold.

2. The method according to claim 1, wherein said main face of the mold volume has a width of about 55 mm and a length of about 85 mm, and the distance between said two main faces is approximately 0.8 mm.

3. The method according to claim 1 wherein said plastic material is injected into said mold volume through an injection hole located in one of said main faces of said mold.

4. The method according to claim 3 wherein said injection hole is located in the part of the main face remote from said projection.

5. The method according to claim 1 wherein said thermoplastic material is an acrylonitrile butadiene styrene which is injected at a temperature lying between 220 degrees Centigrade and 260 degrees Centigrade, and the mold is kept at a temperature lying between 10 degrees Centigrade and 50 degrees Centigrade.

6. A method of making an electronic memory card comprising a card body having bending properties satisfying the requirements of the ISO standard and an electronic module constituting a data medium, the method comprising the steps of:
   (a) providing a mold having a mold volume limited by two parallel main faces substantially rectangular in shape and an edge, said main faces having a width of about 55 mm and a length of about 85 mm, the distance separating said two main faces being approximately 0.8 mm, one of said main faces being provided with an extension for defining a cavity in the card body;

(b) injecting an acrylonitrile butadiene styrene (ABS) to fill all of said mold volume to form the entire card body therewith;

(c) unmolding the card body so obtained;

(d) providing an electronic module comprising an insulating support having electrical contact tabs on one of its two faces and a semiconductor chip fixed on the other face of said insulating support; and (e) placing said electronic module within said cavity and fixing said electronic module to said card body.

7. The method according to claim 6, wherein, after said electronic module has been fixed in place, symbols are embossed on the card body.

8. The method according to claim 6, wherein after said module has been fixed in place, a magnetic track is affixed to the main face of said card body.

9. The method according to claim 6, wherein said electronic module includes a printed circuit component comprising an insulating support having a plurality of holes therethrough together with metallization to define said electrical contact tabs, said metallization closing one end of each of said holes, and wherein a plurality of studs projecting into said cavity are formed when the card body is made by injection molding, with the diameter of such studs being smaller than the diameter of said holes, placing the electronic module into said cavity with said studs on the card body penetrating, respectively, into said holes through the insulating support, and heating said electronic module locally to soften and crush the ends of said studs so that the crushed stud ends spread to engage the periphery of the holes, thereby fastening the electronic module to the card body.

10. A method of making an electronic memory card having dimensional bending properties satisfying the requirements of the ISO standard and an electronic module fastened within a cavity formed in said card body, comprising the steps of:

providing a mold having an inner mold volume limited by two parallel main faces substantially rectangular and an edge, said main faces being separated by a distance less than 1 mm, providing a projection on one of said two main faces for defining said cavity in the card body, providing an injection point on the other of said two main faces, said injection point being opposite said projection, injecting into the mold through said injection point a thermoplastic material to fill said mold volume, thereby forming said card body, unmolding the card body from said mold, and fastening said electronic module into the cavity of said card body.

11. The method of claim 10, further comprising the steps of providing said projection with hollows to define studs extending from a bottom of said cavity in the card body.

12. The method of claim 10, wherein the steps of providing a projection on one of said two main faces comprises providing a core.

13. The method of claim 12, further comprising the step of cooling said core.

* * * * *